(12) United States Patent
Fong

(10) Patent No.: US 9,945,728 B2
(45) Date of Patent: *Apr. 17, 2018

(54) GRAPHENE-BASED INFRARED SINGLE PHOTON DETECTOR

(71) Applicant: RAYTHEON BBN TECHNOLOGIES CORP., Cambridge, MA (US)

(72) Inventor: Kin Chung Fong, Lexington, MA (US)

(73) Assignee: RAYTHEON BBN TECHNOLOGIES CORP., Cambridge, MA (US)

( * ) Notice: Subject to any disclaimer, the term of this patent is extended or adjusted under 35 U.S.C. 154(b) by 111 days.

This patent is subject to a terminal disclaimer.

(21) Appl. No.: 14/793,418

(22) Filed: Jul. 7, 2015

(65) Prior Publication Data

US 2017/0038260 A1 Feb. 9, 2017

Related U.S. Application Data

(60) Provisional application No. 62/143,020, filed on Apr. 3, 2015.

(51) Int. Cl.
| | | |
|---|---|---|
| *G01J 5/22* | (2006.01) | |
| *G01J 5/20* | (2006.01) | |
| *G01J 5/24* | (2006.01) | |
| *G01J 5/08* | (2006.01) | |
| *G01J 1/42* | (2006.01) | |

(Continued)

(52) U.S. Cl.
CPC . *G01J 5/22* (2013.01); *G01J 1/42* (2013.01); *G01J 5/0818* (2013.01); *G01J 5/20* (2013.01); *G01J 5/24* (2013.01); *H01L 31/02327* (2013.01); *H01L 29/1606* (2013.01)

(58) Field of Classification Search
CPC ................................. G01J 5/0818; G01J 5/20
See application file for complete search history.

(56) References Cited

U.S. PATENT DOCUMENTS

| | | |
|---|---|---|
| 5,155,093 A | 10/1992 | Den et al. |
| 7,723,684 B1 | 5/2010 | Haddon et al. |

(Continued)

FOREIGN PATENT DOCUMENTS

JP    2004-286715 A    10/2004

OTHER PUBLICATIONS

Liu et al., A graphene-based broadband optical modulator, Jun. 2 201, Nature, vol. 474, pp. 64-67.*

(Continued)

*Primary Examiner* — Christine Sung
(74) *Attorney, Agent, or Firm* — Lewis Roca Rothgerber Christie LLP

(57) ABSTRACT

A detector for detecting single photons of infrared radiation. In one embodiment a waveguide configured to transmit infrared radiation is arranged to be adjacent a graphene sheet and configured so that evanescent waves from the waveguide overlap the graphene sheet. The graphene sheet has two contacts connected to an amplifier, a power detector, and a pulse detector. An infrared photon absorbed by the graphene sheet from the evanescent waves heats the graphene sheet, which increases the Johnson noise generated at the contacts. The Johnson noise is amplified and the absorption of a photon is detected by the power detector and pulse detector.

20 Claims, 10 Drawing Sheets

(51) Int. Cl.
*H01L 31/0232* (2014.01)
*H01L 29/16* (2006.01)

(56) References Cited

U.S. PATENT DOCUMENTS

| | | | |
|---|---|---|---|
| 8,436,305 B1 | 5/2013 | Sood et al. | |
| 8,916,825 B1* | 12/2014 | Egerton | G01J 5/046 250/338.4 |
| 9,105,793 B2 | 8/2015 | Bouchiat et al. | |
| 9,196,766 B1 | 11/2015 | Egerton et al. | |
| 2008/0251723 A1 | 10/2008 | Ward et al. | |
| 2009/0233798 A1 | 9/2009 | Maeda et al. | |
| 2011/0042650 A1* | 2/2011 | Avouris | H01L 29/1606 257/29 |
| 2013/0105795 A1* | 5/2013 | Kim | H01L 31/028 257/49 |
| 2013/0342279 A1* | 12/2013 | Sensale-Rodriguez | H03C 7/00 332/179 |
| 2014/0056551 A1* | 2/2014 | Liu | G02F 1/025 385/2 |
| 2014/0103213 A1* | 4/2014 | Maliakal | G02B 6/10 250/343 |
| 2015/0109606 A1 | 4/2015 | Peale et al. | |
| 2015/0372159 A1* | 12/2015 | Englund | H01L 31/09 356/328 |
| 2016/0370232 A1* | 12/2016 | Fong | G01J 5/0818 |
| 2016/0372622 A1* | 12/2016 | Fong | H01L 31/109 |

OTHER PUBLICATIONS

Xu et al., Photo-Thermoelectric Effect at a Graphene Interface Junction, Nov. 10, 2009, American Chemical Society, vol. 10, pp. 562-566.*
Xia et al., Ultrafast graphene photodetector, Dec. 2009, Nature Nanotechnology, vol. 4, pp. 839-843.*
Du, et al., Graphene-based Bolometers) Graphene and 2D Materials, Aug. 1, 2013 URL:https://arxiv.org/ftp/arxiv/papers/1308/1308.4065.pdf (50 pgs.).
Koester, et al., "Waveguide-Coupled Graphene Optoelectronics" IEEE Journal of Selected Topics in Quantum Electronics, vol. 20, No. 1, Jan./Feb. 2014 (11 pgs.).
McKitterick, et al., "Performance of Graphene Thermal Photon Detectors" Journal of Applied Physics 113, 044512-1 to 044512-6, 2013.
International Search Report related International Application No. PCT/US2016/027946, International Search Report dated Jul. 15, 2016 and mailed Oct. 10, 2016 (5 pgs.)
Written Opinion of the Internaitonal Searching Authority from related International Application No. PCT/US2016/027964, dated Oct. 10, 2016 (7 pgs.).
International Search Report from corresponding International Application No. PCT/US2016/016346, International Search Report dated Apr. 28, 2016 and mailed Jul. 11, 2016 (6 pgs.)
Written Opinion of the International Searching Authority from corresponding International Application No. PCT/US2016/016436, dated Jul. 11, 2016 (9 pgs.).
Avouris, et al., "Graphene Photonics, Plasmonics, and Optoelectronics", IEEE Journal of Selected Topics in Quantum Electronics, vol. 20, No, 1, Jan. 1, 2014, p. 6000112 (12 pgs.).
Gan, et al., "Chip-Integrated Ultrafast Grapheme Photodetector With High Responsivity", Nature Photonics, vol. 7, No. 11, Sep. 15, 2013 (pp. 883-887).
Karasik, et al, "Monolayer Graphene Bolometer as a Sensitive Far-IR Detector", Optomechatronic Micro/Nano Devices and Components III : Oct. 8-10, 2007, vol. 9153, Jul. 23, 2014, (pp. 915309-1-915309-9).
Invitation to Pay Additional Fees in related International Patent Application No. PCT/US2016/016436, filed Feb. 3, 2016, Invitation to Pay Additional Fees mailed May 6, 2016 (7 pgs.).

Vicarelli, et al., "Graphene Field-Effect Transistors As Room-Temperature Terahertz Detectors", Nature Materials, Advance Online Publication, Published Sep. 9, 2012 (pp. 1-7).
Walsh, et al., "Detecting Single Photons by Graphene-Based Josephson Junctions", Department of Electrical Engineering and Computer Science, Massachusetts Institute of Technology, Cambridge, MA, Dated Mar. 8, 2016 (10 pgs.).
Bozzi et al., "Current and Future Research Trends in Substrate Integrated Waveguide Technology," Radioengineering, 18(2):201-209, Jun. 2009.
Castellanos-Beltran et al., "Widely tunable parametric amplifier based on a superconducting quantum interference device array resonator," Applied Physics Letters, 91, 083509, 3 pages, 2007.
CITLF3, Cryogenic SiGe Low Noise Amplifier, 4 pages, Mar. 11, 2014.
CITCRY04-12A, Cryogenic HEMT Low Noise Amplifier, 3 pages, Oct. 13, 2010.
Crossno et al., "Development of high frequency and wide bandwidth Johnson noise thermometry," Applied Physics Letters, 106, 023121, 4 pages, 2015.
Eom et al., "A wideband, low-noise superconducting amplifier with high dynamic range," Nature Physics, 8:623-627, Aug. 2012.
Fong et al., "Measurement of the Electronic Thermal Conductance Channels and Heat Capacity of Graphene at Low Temperature," Physical Review X, 3, 041009, 7 pages, 2013.
Fong et al., "Measurement of the Electronic Thermal Conductance Channels and Heat Capacity of Graphene at Low Temperature," Applied Physics, California Institute of Technology, 7 pages, 2013.
Fong et al., "Ultrasensitive and Wide-Bandwidth Thermal Measurements of Graphene at Low Temperatures," Physical Review X, 2, 031006, 8 pages, 2012.
Fong et al., "Ultrasensitive and Wide-Bandwidth Thermal Measurements of Graphene at Low Temperatures," Applied Physics, California Institute of Technology, 18 pages, Jul. 24, 2012.
Karasik et al., "Normal-Metal Hot-Electron Nanobolometer With Johnson Noise Thermometry Readout," IEEE Trans. On Terahertz Sci. and Tech., 6 pages, 2014.
Lee et al., "Fabrication of ultralow-loss Si/SiO$_2$ waveguides by roughness reduction," Optics Letters, 26(23):1888-1890, Dec. 1, 2001.
McKitterick et al., "Performance of graphene thermal photon detectors," Journal of Applied Physics, 113, 044512, 6 pages, 2013.
Mück et al., "Superconducting quantum interference device as a near-quantum-limited amplifier at 0.5 Ghz," Applied Physics Letters, 78(7):967-969, Feb. 12, 2001.
Soltani, "Novel Integrated Silicon Nanophotonics Structures using Ultra-high Q Resonators," School of Electrical and Computer Engineering, Georgia Institute of Technology, 425 pages, Dec. 2009.
Wang et al., "One-Dimensional Electrical Contact to a Two-Dimensional Material," 342:614-617, Nov. 1, 2013.
Yan et al., "Dual-gated bilayer graphene hot-electron bolometer," Nature Nanotechnology, 7:472-478, Jul. 2012.
Invitation to Pay Additional Fees in related International Patent Application No. PCT/US2015/028522, filed Apr. 20, 2016, Invitation to Pay Additional Fees dated Oct. 21 2016 (6 pgs.).
McKitterick, et al. "Ultrasensitive graphene far-infrared power detectors", Journal of Physics: Condensed Matter, Institute of Physics Publishing, Bristol, GB, vol. 27, No. 16, Apr. 2, 2015 (13 pgs.).
Du, et al. "Graphene-based Bolometers", Graphene and 2D Materials, vol. 1, No, 1, Jan. 1, 2014. pp. 1-22.
Koppens, et al. "Photodetectors based on graphene, other two-dimensional materials and hybrid systems", Nature Nanotechnology, vol. 9, Oct. 2014 (pp. 780-793).
International Search Report from related International Application No. PCT/US2016/028522, International Search Report dated Oct. 13, 2016 and mailed Dec. 15, 2016 (7 pgs.).
Written Opinion of the International Searching Authority from related International Application No. PCT/US2016/028522, dated Dec. 15, 2016 (9 pgs.).

* cited by examiner

GRAPHENE-BASED INFRARED SINGLE PHOTON DETECTOR

CROSS-REFERENCE TO RELATED APPLICATION(S)

The present application claims priority to and the benefit of U.S. Provisional Application No. 62/143,020, filed Apr. 3, 2015, entitled "GRAPHENE-BASED INFRARED SINGLE-PHOTON DETECTOR (G-SPD)", the entire content of which is incorporated herein by reference.

BACKGROUND

1. Field

One or more aspects of embodiments according to the present invention relate to detection of photons, and more particularly to a detector for detecting individual photons of infrared light.

2. Description of Related Art

Detectors capable of detecting single photons have multiple applications, including applications in quantum communications. Such detectors, for high-energy photons, may be constructed according to a variety of designs. For low energy photons, such as photons with wavelengths of 1 micron or more, however, there is a gap in detector technology. In particular, existing communications systems may use a wavelength of 1550 nm, and other components, such as lasers, designed to operate at this wavelength may be readily available, resulting in applications for detectors operating at the same wavelength. Thus, there is a need for a single-photon detector for low-energy photons.

SUMMARY

Aspects of embodiments of the present disclosure are directed toward a detector for detecting single photons of infrared radiation. In one embodiment a waveguide configured to transmit infrared radiation is arranged to be adjacent a graphene sheet and configured so that evanescent waves from the waveguide overlap the graphene sheet. The graphene sheet has two contacts connected to an amplifier, a power detector, and a pulse detector. An infrared photon absorbed by the graphene sheet from the evanescent waves heats the graphene sheet, which increases the Johnson noise generated at the contacts. The Johnson noise is amplified and the absorption of a photon is detected by the power detector and pulse detector.

According to an embodiment of the present invention there is provided a photon detector including: a waveguide configured to guide infrared electromagnetic waves, in a mode having an evanescent field extending outside of the waveguide; a graphene sheet having two contacts and configured: to be coupled to the evanescent field; and to undergo, when a photon is absorbed by the graphene sheet, an increase in temperature and a subsequent decrease in temperature, resulting in a corresponding increase in thermal noise at the two contacts and a subsequent decrease in thermal noise at the two contacts; and a circuit connected to the two contacts, the circuit configured to detect the increase in thermal noise.

In one embodiment, the graphene sheet has an electron mobility of more than 100,000 $cm^2/V/s$.

In one embodiment, the graphene sheet substantially has the shape of a rectangle, the rectangle having a length and a width, the length being greater than or equal to the width.

In one embodiment, the length of the rectangle is less than 20 microns.

In one embodiment, the product of the length of the rectangle and the width of the rectangle is less than 1000 square microns.

In one embodiment, the waveguide has a curved section, the curved section having a radius of curvature less than the length of the rectangle, the curved section resulting in a change of direction of the waveguide of at least 45 degrees.

In one embodiment, the waveguide includes a reflector.

In one embodiment, the waveguide is on a substantially flat substrate, in a layer on a surface of the substrate, the layer having a thickness greater than 10 nanometers and less than 2 microns.

In one embodiment, the photon detector includes a first layer of hexagonal boron nitride immediately adjacent a first surface of the graphene sheet, and a second layer of hexagonal boron nitride immediately adjacent a second surface of the graphene sheet.

In one embodiment, each of the first layer of hexagonal boron nitride and the second layer of hexagonal boron nitride has a thickness greater than 4 nm and less than 40 nm.

In one embodiment, the circuit includes an amplifier connected to the two contacts.

In one embodiment, the photon detector includes a matching circuit connected between the two contacts and the amplifier.

In one embodiment, the matching circuit includes an inductor and a capacitor.

In one embodiment, the photon detector includes a power detector connected to the amplifier.

In one embodiment, the photon detector includes a pulse detector connected to the power detector, the pulse detector including a voltage reference and a comparator configured to compare the output of the power detector to the output of the voltage reference.

In one embodiment, the graphene sheet consists of a single atomic layer of graphene.

In one embodiment, the graphene sheet includes two atomic layers of graphene.

In one embodiment, the photon detector includes a refrigerator configured to cool the graphene sheet to a temperature below 4 K.

In one embodiment, the refrigerator is a pulse tube refrigerator.

In one embodiment, the refrigerator is a Gifford-McMahon cooler.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a graphene-based infrared single photon detector provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
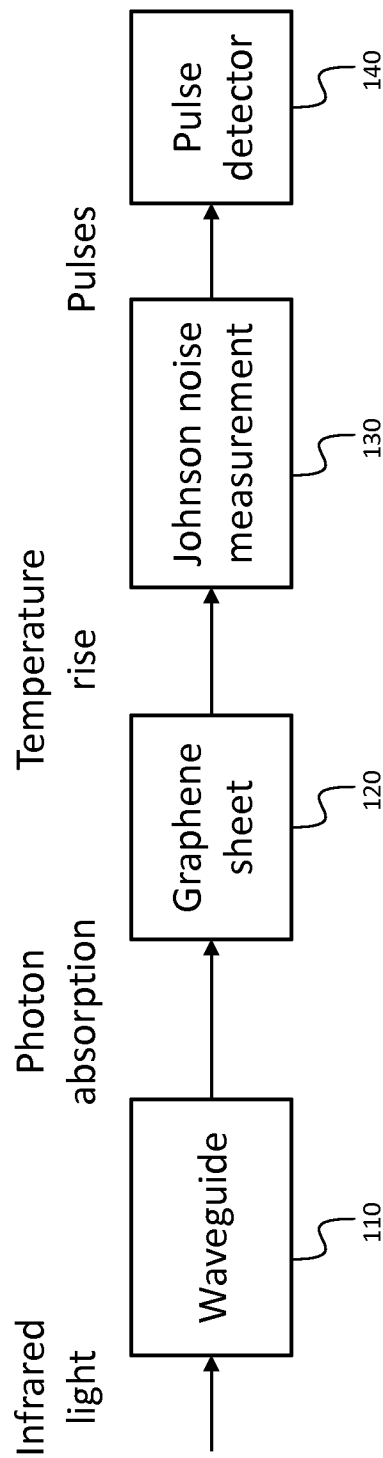
FIG. 1 is a block diagram of a single photon detector according to an embodiment of the present invention.

Referring to FIG. 1, in one embodiment, a single-photon detector for infrared light includes an infrared waveguide 110 and a graphene sheet 120 forming a sensor assembly, and a thermal noise or "Johnson noise" measuring circuit 130 for monitoring the Johnson noise (i.e., the thermal noise) generated by the graphene sheet 120. When infrared electromagnetic waves propagate in the waveguide 110, evanescent waves outside the waveguide 110 overlap with, and couple to, the graphene sheet 120. This coupling allows photons of the electromagnetic waves to be absorbed by the graphene sheet 120, raising the temperature of the graphene sheet 120. This increase in temperature may be detected, by a pulse detector 140, from a corresponding increase in the Johnson noise produced by the graphene sheet 120.

Figure 3A:
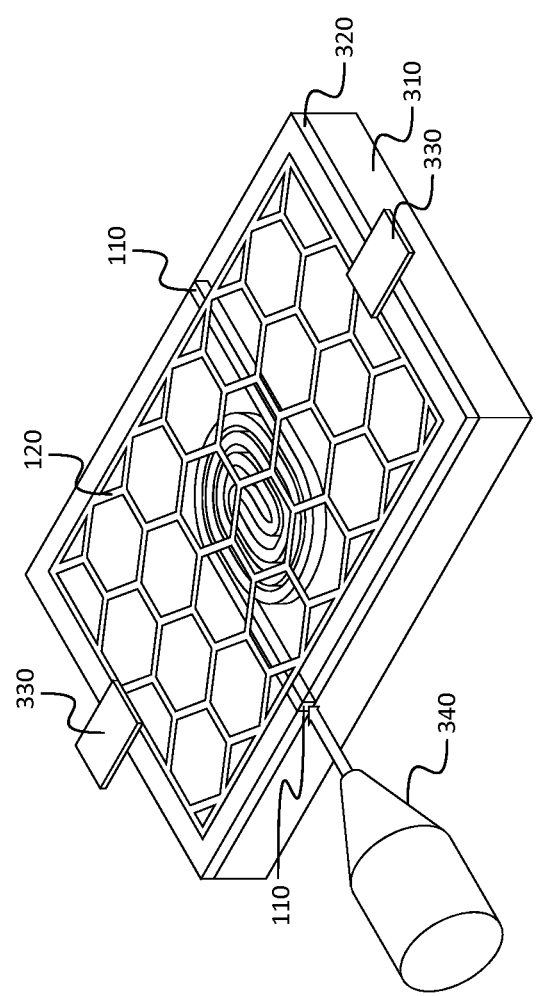
FIG. 3A is a perspective view of a sensor assembly according to an embodiment of the present invention.

When an infrared photon is absorbed by the graphene sheet 120, the absorption occurs primarily through interaction of the photon with the electronic degrees of freedom of the graphene sheet 120, the interactions between the photon and the nuclei of the graphene sheet 120 being significantly weaker. Electrons in the graphene sheet 120 are weakly coupled to phonons in the graphene sheet 120, so that the absorption of a photon results in a relatively large and rapid increase in the electron temperature, which in turn results in a relatively large and rapid increase in the Johnson noise of the potential between any pair of spatially separated points on the graphene sheet 120. The Johnson noise may be measured at two contacts 330, disposed, for example, at two ends of a rectangular graphene sheet 120 (FIG. 3A). Shortly after the temperature increases, it may again decrease (as a result of various mechanisms by which heat may leave the graphene sheet 120), and there may be a corresponding decrease in the Johnson noise produced across the two contacts 330 by the graphene sheet 120.

Figure 2:
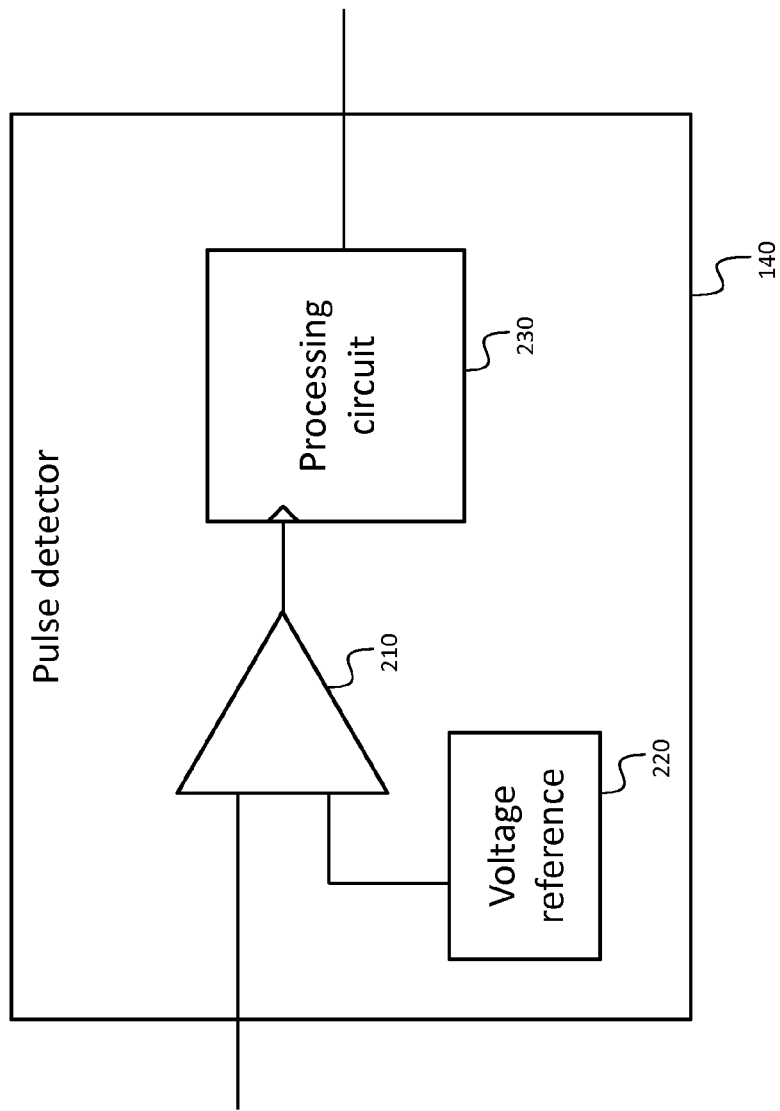
FIG. 2 is a block diagram of a pulse detector according to an embodiment of the present invention.

A pulse detector connected to the Johnson noise measuring circuit 130 may be used to detect the absorbed photons. Referring to FIG. 2, the input to the pulse detector may be a voltage from the output of the Johnson noise measuring circuit 130, representing the instantaneous temperature as measured by the Johnson noise power. The pulse detector may have a set threshold voltage, corresponding to a threshold temperature, and it may generate a digital output pulse, or increment a photon count register, each time the input voltage increases past the threshold, i.e., crosses the threshold value with a positive time-derivative. For example, the pulse detector may include a comparator 210, one input of which is (or is connected to) the input of the pulse detector, a second input of which is connected to a voltage reference 220 that defines the threshold voltage, and accordingly, the threshold temperature, and the output of which is connected to a digital processing circuit 230. For example the output of the comparator may be connected to the clock input of a flip-flop or other edge-triggered circuit, so that the detection of a photon causes an essentially immediate change of state in the processing circuit.

Referring to FIG. 3A, the waveguide 110 and the graphene sheet 120 of the sensor assembly may be fabricated as an integrated component on a substrate 310. The waveguide 110 may be fabricated by any of various methods known in the art for fabricating a waveguide 110 on the surface of a substrate 310. In one embodiment, a layer of silicon dioxide is formed on a silicon substrate 310, and patterned using photolithography to form the core of the waveguide 110 as a raised structure. A layer 320 of silicon nitride may then be formed over the waveguide 110 and the surrounding area, so that the waveguide 110 core has silicon nitride on both sides of it and above it. This structure may then be polished, so that the upper surface of the structure is flat and smooth. In other embodiments, the waveguide 110 may be formed by depositing a layer of silicon dioxide on a silicon substrate 310, depositing a layer of silicon on the silicon dioxide, and patterning the silicon layer using photolithography to form the waveguide 110 as a raised silicon structure. This structure may then be planarized, i.e., made flat and smooth, by depositing an additional layer of silicon dioxide and polishing it down to the top surface of the raised silicon structure. In other embodiments the waveguide 110 may be composed of another first material, surrounded by one or more other materials having a lower index of refraction than the first material. The resulting waveguide structure may have a thickness of between 50 nm and 2000 nm; in one embodiment it has a thickness of between 100 nm and 1000 nm. The transverse dimensions of the waveguide structure may be somewhat smaller or considerably smaller than the wavelength of the infrared light to be detected. The waveguide 110 may be single-mode or multi-mode when guiding light at the wavelength of the infrared light to be detected. The substrate may be substantially flat, e.g., within 1 micron of being flat over the area including the waveguide, and the waveguide may be formed, e.g., using one of the processes described above, in a layer having a thickness greater than 50 nanometers and less than 2 microns. The front end of the waveguide 110 may extend to the edge of the substrate 310 as shown, and off-chip coupling optics 340 may be used to launch infrared light into the waveguide 110. In other embodiments portions of the coupling optics may be fabricated on the substrate 310. In some embodiments the waveguide 110 is omitted and infrared light propagating in free space illuminates the graphene sheet 120 directly.

The waveguide 110 may be straight, and, to increase the amplitude of the evanescent waves overlapping the graphene sheet 120, it may be part of an optical resonator, constructed, for example, by forming a reflector (e.g., a Bragg reflector) at each end of a section of the waveguide 110. Bragg reflectors may be formed by creating periodic defects in or adjacent the waveguide 110, e.g., by forming holes in or adjacent the waveguide structure with a focused ion beam. The reflector at the front end of the waveguide 110 (i.e., the end first encountered by the arriving infrared light) may be partially reflective, to allow the infrared light to enter the resonator, and the reflector at the other end (the "back" end) of the waveguide 110 may be highly reflective, to avoid allowing light to escape from the back end of the waveguide 110. In some embodiments only one reflector is used, at the back end of the waveguide 110.

In other embodiments the waveguide 110 may not be straight, but may have one or more curves, increasing the length of the section of waveguide 110 that is adjacent the graphene sheet 120, and from which evanescent waves may interact with the graphene sheet 120. A curved section in the waveguide may have a radius of curvature less than the length of the graphene sheet, and in the curved section the direction of the waveguide may change by 45 degrees or more. The increased length of the section of waveguide 110 adjacent the graphene sheet 120 may increase the probability, for any photon launched into the waveguide 110, of being absorbed by the graphene sheet 120. The waveguide 110 may have a double spiral shape as illustrated in FIG. 3A. In other embodiments the waveguide 110 may have the shape of a single spiral, with the back end of the waveguide in the center of the spiral. The back end of the waveguide 110 may be at an edge of the substrate 310 as illustrated in FIG. 3A, or it may be elsewhere on the substrate 310, e.g., near the middle in the case of a waveguide 110 in the shape of a single spiral.

Figure 3B:
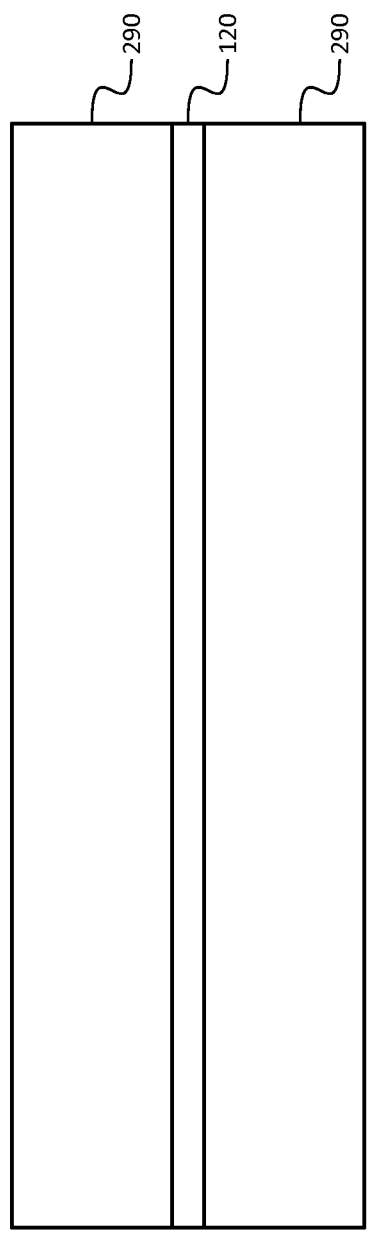
FIG. 3B is a schematic side view of a graphene sheet sandwiched between two layers of hexagonal boron nitride, according to an embodiment of the present invention.
Figure 3C:
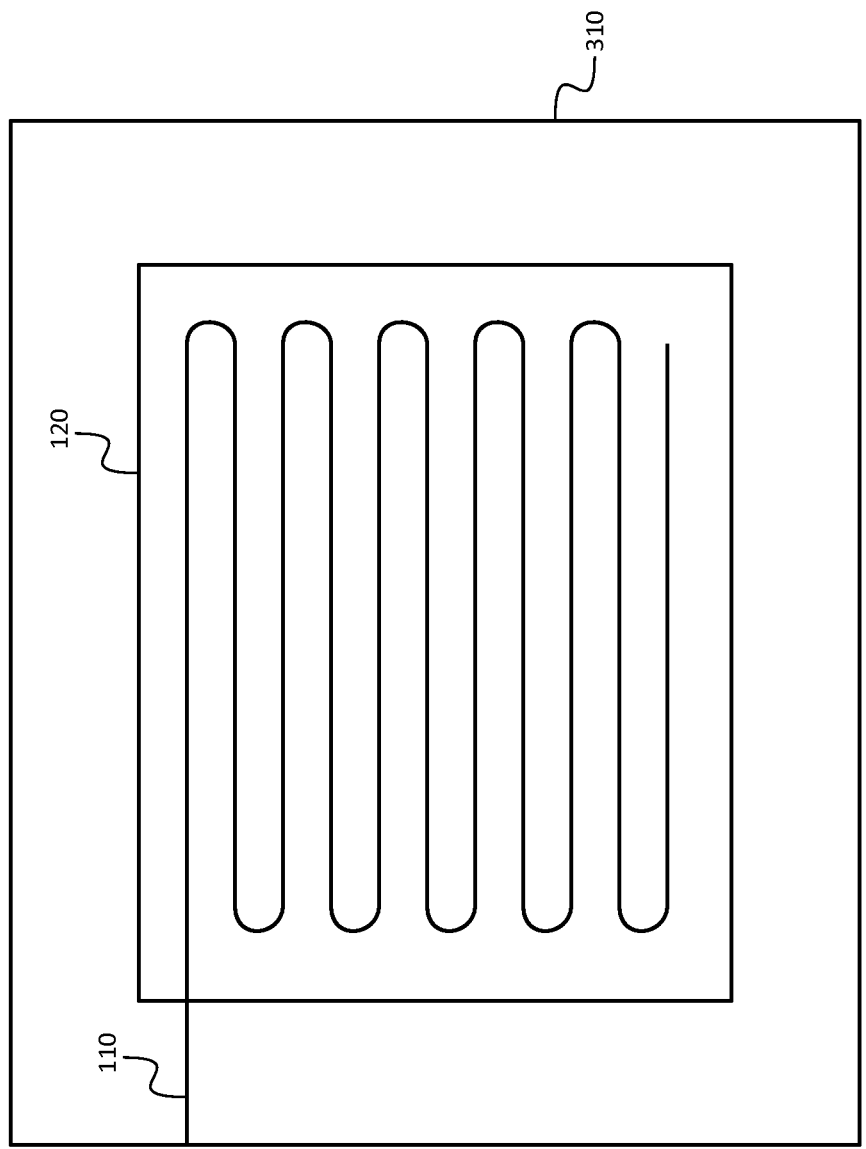
FIG. 3C is a schematic plan view of a sensor assembly according to an embodiment of the present invention.

Referring to FIG. 3C, in one embodiment the waveguide 110 may have a meandering shape, covering a region that roughly corresponds to the extent of the graphene sheet 120 as illustrated.

In yet other embodiments, the waveguide 110 may have one or more curves and also form part of a resonator, to further increase the absorption probability for photons launched into the waveguide 110.

Figure 3D:
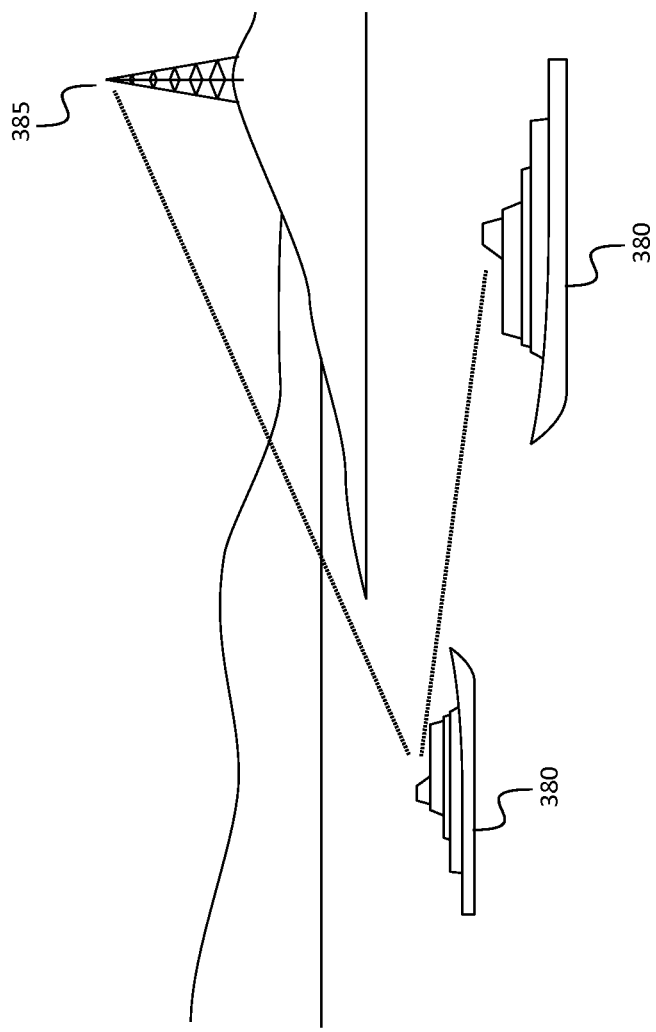
FIG. 3D is a perspective view of a communications system including mobile transceivers according to an embodiment of the present invention.

Infrared light may be launched into the waveguide 110 by any of several systems known to those of skill in the art. For example, if the infrared light to be detected is initially travelling in free space, it may be coupled into the waveguide 110 using one or more suitable powered optics, such as lenses or curved mirrors. Referring to FIG. 3D, transceivers using coupling to free-space propagating waves may be used for mobile communications e.g., between ships 380 and a tower 385.

If the infrared light to be detected is initially propagating in an optical fiber, it may be launched into the waveguide 110 of the single photon detector using any suitable one of a variety of fiber-to-chip couplers known to those of skill in the art.

The graphene sheet 120 may be a single-layer sheet, i.e., it may be one atomic layer thick, or it may be a multi-layer graphene sheet 120, having, e.g., 2, 3, 4, or more layers. Referring to FIG. 3B, in one embodiment, the graphene sheet 120 is encapsulated in hexagonal boron nitride (hBN). As is known to those of skill in the art, a sandwich is formed, with the graphene sheet 120 sandwiched between two layers 290 of hexagonal boron nitride. Each layer 290 of hexagonal boron nitride may be between 4 nm and 40 nm thick; these layers 290 of hexagonal boron nitride may keep the surface of the graphene sheet 120 clean, i.e., they may prevent surface contamination from compromising the properties of the graphene sheet 120. The sandwich, composed of the two outer layers 290 of hexagonal boron nitride encapsulating the graphene sheet 120, may then be disposed on the portion of the substrate 310 that includes the waveguide 110.

Each hexagonal boron nitride layer 290 may be a single crystal, with an atomically flat surface facing the graphene sheet 120. Each hexagonal boron nitride layer 290 may be annealed, e.g., at 250° C. for 10-15 minutes, before the sandwich is assembled. The sandwich may be formed by first bringing a first layer 290 of hexagonal boron nitride into contact with the graphene sheet 120, resulting in adhesion of the graphene sheet 120 to the hexagonal boron nitride by van der Waals forces, and then bringing the graphene sheet 120, on the first layer 290 of hexagonal boron nitride, into contact with the second layer 290 of hexagonal boron nitride, resulting in adhesion, again by van der Waals forces, at the interface between the graphene sheet 120 and the second layer 290 of hexagonal boron nitride. The edges of the sandwich may then be etched, e.g. using plasma etching, so that the edges of the two layers 290 of hexagonal boron nitride and the edges of the graphene sheet 120 in the structure remaining after the etch process coincide (i.e., are aligned).

The graphene sheet 120 may be rectangular as illustrated in FIG. 3A, with a length and a width, the length being greater than or equal to the width. The total area of the graphene sheet 120 may be less than 1000 square microns. In one embodiment the graphene sheet 120 is about 10 microns by 10 microns. In one embodiment the graphene sheet 120 has a length in the range 1.0-100.0 microns and a width in the range 1.0-100.0 microns. An electrical contact 330 may be provided at each of two opposing sides or ends of the graphene sheet 120. In one embodiment, contact is made with the edge of the graphene sheet 120, using a layer of metal deposited onto the edge of the sandwich.

For good performance, the graphene sheet 120 may be made as small as possible, kept as clean as possible, and operated at as low a temperature as possible. In one embodiment, the graphene sheet 120 is cooled to 4 K, using, for example, a pulse tube refrigerator or a Gifford-McMahon (GM) cooler. In other embodiments direct cooling with liquid helium, or with liquid helium in a partial vacuum (e.g., using a 1 K pot, to reach temperatures below 4 K) may be used to cool the graphene sheet 120.

The Johnson noise power at the two contacts may be proportional to the electron temperature of the graphene sheet 120. As used herein, the temperature of the graphene sheet 120 refers to the temperature of the electrons in the graphene sheet 120; immediately after the absorption of a photon, the electron temperature may differ from the phonon temperature.

Figure 4:
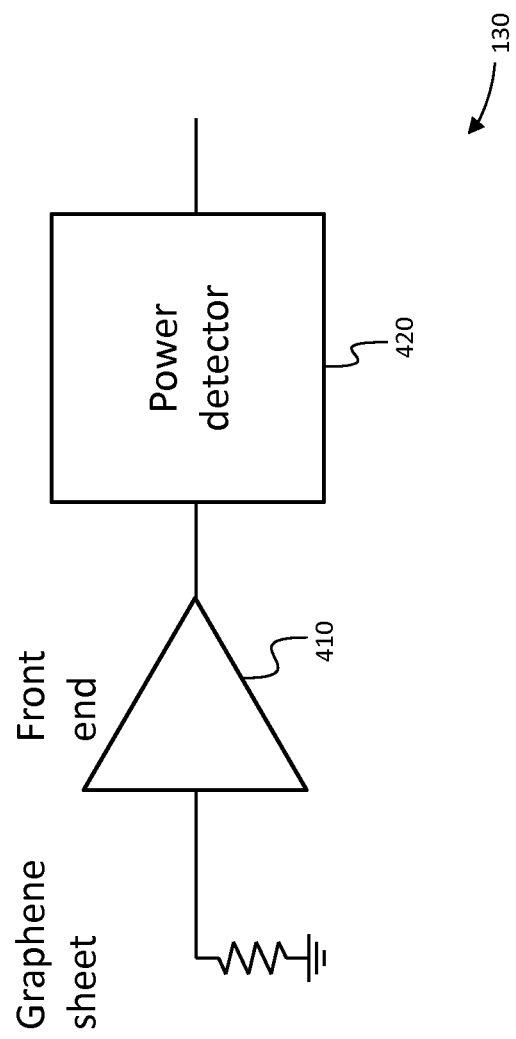
FIG. 4 is a block diagram of a Johnson noise measuring circuit according to an embodiment of the present invention.
Figure 5:
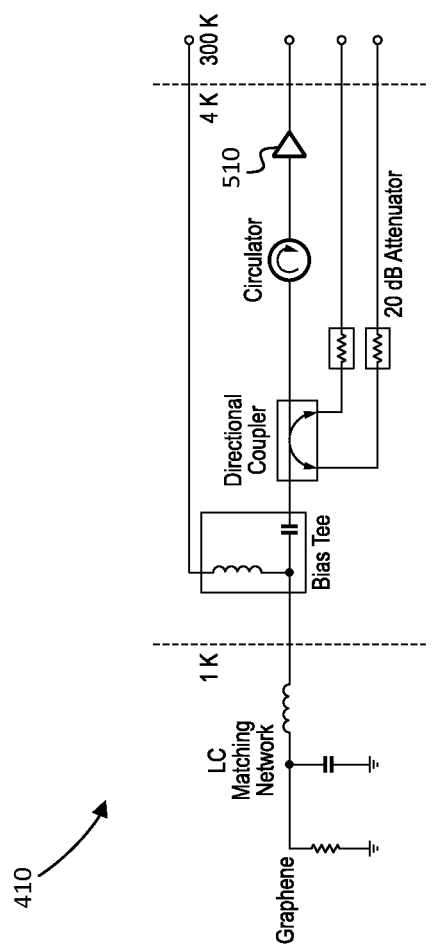
FIG. 5 is a schematic diagram of a front end circuit according to an embodiment of the present invention.

In one embodiment, referring to FIG. 4, a Johnson noise measuring circuit 130 includes a front end circuit 410 for amplifying the Johnson noise and a power detector 420 that converts the noise signal to a power signal or temperature signal having a value (e.g., a voltage) corresponding to (e.g., proportional to) the noise power. Referring to FIG. 5, the front end circuit 410 may include an amplifier 510 that may include a quantum noise limited amplifier followed by a high electron mobility transistor (HEMT) amplifier. The front end circuit 410 may also include a matching network, e.g., an inductor-capacitor (LC) matching network, for transforming the impedance of the graphene sheet 120, which may be about 1,000 ohms, to the input impedance of the amplifier 510 (which may be about 50 ohms). In one embodiment the amplifier 510 has a bandwidth of about 80 MHz around a frequency of about 1.1 GHz, and the matching network is tuned for a frequency of 1.1 GHz. In some embodiments the quantum noise limited amplifier may be a radio frequency superconducting quantum interference device (RF SQUID) amplifier, or it may be a travelling wave parametric amplifier, or a tuned system parametric amplifier (TPA), or any other kind of amplifier with a suitable frequency response that is quantum noise limited or nearly quantum noise limited. In some embodiments the amplifier 510 does not include quantum noise limited amplifier, and has a HEMT amplifier as the first stage instead.

The front end may also include components and connections that may be used for diagnostics, e.g., during manufacturing, operation, or service. A bias tee may be used, for example, to drive a low-frequency current through the graphene sheet 120, modulating its temperature, and the presence of a corresponding modulation at the output of the power detector may then be used to verify the functioning of the device. The differential thermal conductance of the graphene sheet 120 may also be measured in this manner. A directional coupler may be used to supply microwave power to the graphene sheet 120, while monitoring the output of the power detector; this microwave power is essentially entirely absorbed, and this technique may be used to measure the differential thermal conductance as well. A circulator may be used at the input of the amplifier 510 to prevent reflections, backwards-propagating amplifier noise, or signals travelling in reverse through the amplifier 510, from heating the graphene sheet 120.

The power detector of FIG. 4 may be a circuit for producing an output signal proportional to the total power at its input. It may include, for example, a Schottky diode biased (e.g., with a bias tee) so that, in addition to the bias current, it conducts a low-frequency current approximately proportional to the square of the microwave signal applied across its terminals. This low-frequency current may then be measured (e.g., as a change in the bias current). In other embodiments the power detector may be constructed according to another of various power detector circuits known to those of skill in the art. The output of the power detector need not be proportional to the input power, and may, for example, be a nonlinear function of the input power.

Figure 6:
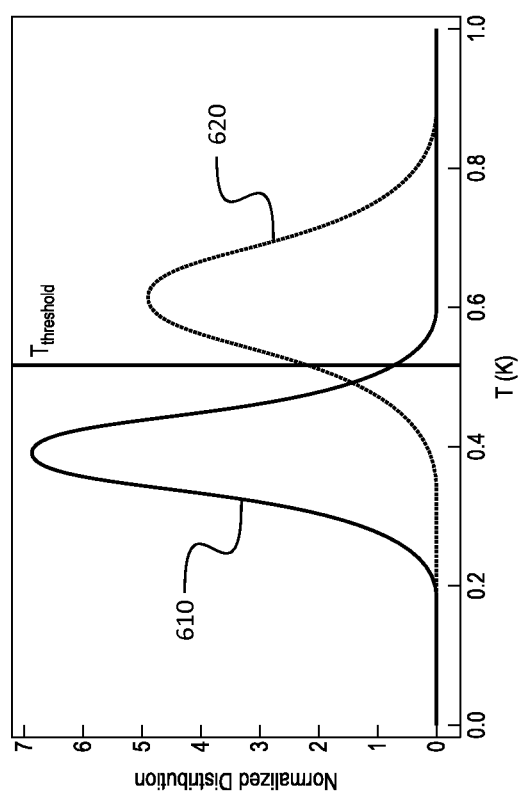
FIG. 6 is a graph of temperature probability distributions according to an embodiment of the present invention.

The threshold of the pulse detector may be adjusted to adjust both the dark count rate and the quantum efficiency. Referring to FIG. 6, the Johnson noise power may fluctuate, in the absence of absorbed photons, according to a first probability distribution 610, plotted in FIG. 6 against the corresponding temperature. Similarly, the peak Johnson noise power after absorption of a photon may vary with a second probability distribution 620. If the threshold of the pulse detector is set to a relatively low value, corresponding to a relatively low temperature, then the frequency with which the Johnson noise power in the absence of absorbed photons exceeds it will be relatively high, and the dark count rate accordingly will be relatively high. If the threshold of the pulse detector is set to a relatively low value, however, the quantum efficiency will be relatively high, a greater fraction of the second probability distribution 620 being above the corresponding threshold temperature.

Conversely, if the threshold of the pulse detector is set to a relatively high value, corresponding to a relatively high temperature, then the frequency with which the Johnson noise power in the absence of absorbed photons exceeds it will be relatively low, and the dark count rate accordingly will be relatively low. If the threshold of the pulse detector is set to a relatively high value, however, the quantum efficiency will be relatively low, a greater fraction of the second probability distribution 620 being below the corresponding threshold temperature.

The greater the separation between the probability distribution 610 of the Johnson noise power in the absence of absorbed photons, and the probability distribution 620 of the peak Johnson noise power after absorption of a photon, the higher the achievable quantum efficiency for a certain dark count rate will be, or, equivalently, the lower the achievable dark count rate for a certain quantum efficiency will be. The separation between the probability distributions may be affected by the size of the graphene sheet 120, the cleanliness of the graphene sheet 120, and the temperature of the graphene sheet 120 in the absence of absorbed photons. The smaller and cleaner the graphene sheet 120 is, and the lower its temperature, the greater will be the separation between the first probability distribution 610 and the second probability distribution 620. The cleanliness of the graphene sheet 120 may be quantified as an impurity density level, with a cleaner graphene sheet having a lower impurity density level, or as an electron mobility, with a cleaner graphene sheet having a higher electron mobility.

Figure 7:
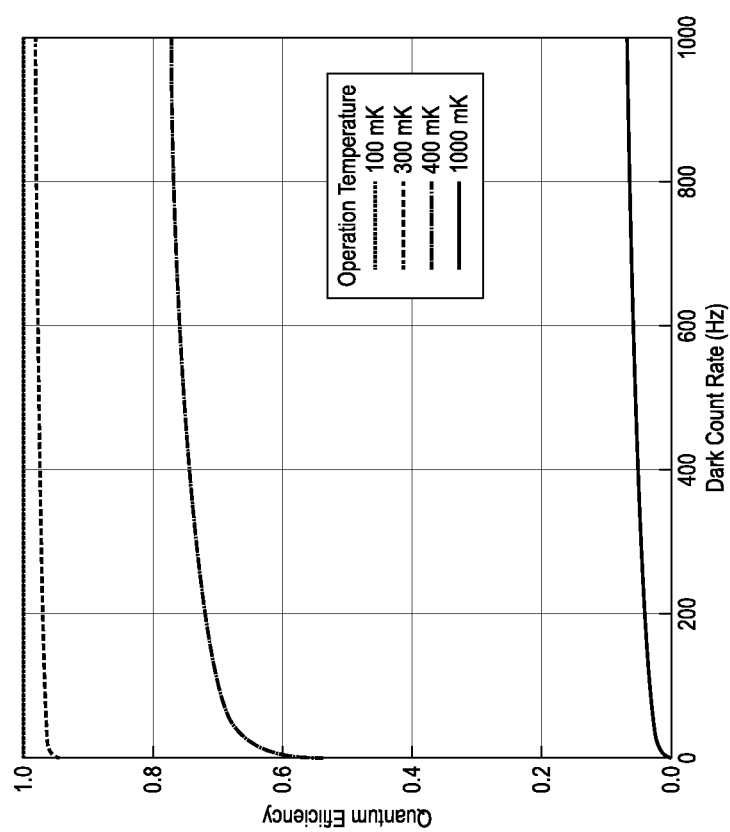
FIG. 7 is a graph of quantum efficiency as a function of dark count rate, according to an embodiment of the present invention.

Referring to FIG. 7, in one embodiment as the threshold of the pulse detector is decreased (moving from left to right along any one of the four curves of the plot), the dark noise increases and the quantum efficiency also increases. The data plotted in FIG. 7 show expected performance for an embodiment with a 10 micron by 10 micron square graphene sheet 120, with an impurity density level of $10^9/cm^2$, corresponding to an electron mobility of about 500,000 $cm^2$/V/s. As can be seen from FIG. 7, at lower temperature the quantum efficiency, for any dark count rate, is higher than at higher temperature.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent" another element or layer, it may be directly on, connected to, coupled to, or adjacent the other element or layer, or one or more intervening elements or layers may be present. In contrast, when an element or layer is referred to as being "directly on", "directly connected to", "directly coupled to", or "immediately adjacent" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although limited embodiments of a graphene-based infrared single photon detector have been specifically described and illustrated herein, many modifications and variations will be apparent to those skilled in the art. Accordingly, it is to be understood that a graphene-based infrared single photon detector employed according to principles of this invention may be embodied other than as specifically described herein. The invention is also defined in the following claims, and equivalents thereof.

What is claimed is:

1. A photon detector comprising:
   a waveguide configured to guide infrared electromagnetic waves, in a mode having an evanescent field extending outside of the waveguide;
   a graphene sheet having two contacts and configured:
      to be coupled to the evanescent field; and
      to undergo, when a photon is absorbed by the graphene sheet, an increase in temperature and a subsequent decrease in temperature, resulting in a corresponding increase in Johnson noise at the two contacts and a subsequent decrease in Johnson noise at the two contacts; and
   a circuit connected to the two contacts, the circuit configured to detect the increase in Johnson noise.

2. The photon detector of claim 1, wherein the graphene sheet has an electron mobility of more than 100,000 $cm^2/V/s$.

3. The photon detector of claim 1, wherein the graphene sheet substantially has the shape of a rectangle, the rectangle having a length and a width, the length being greater than or equal to the width.

4. The photon detector of claim 3, wherein the length of the rectangle is less than 20 microns.

5. The photon detector of claim 3, wherein the product of the length of the rectangle and the width of the rectangle is less than 1000 square microns.

6. The photon detector of claim 3, wherein the waveguide has a curved section, the curved section having a radius of curvature less than the length of the rectangle, the curved section resulting in a change of direction of the waveguide of at least 45 degrees.

7. The photon detector of claim 1, wherein the waveguide comprises a reflector.

8. The photon detector of claim 1 wherein the waveguide is on a substantially flat substrate, in a layer on a surface of the substrate, the layer having a thickness greater than 10 nanometers and less than 2 microns.

9. The photon detector of claim 1, comprising a first layer of hexagonal boron nitride immediately adjacent a first surface of the graphene sheet, and a second layer of hexagonal boron nitride immediately adjacent a second surface of the graphene sheet.

10. The photon detector of claim 9, wherein each of the first layer of hexagonal boron nitride and the second layer of hexagonal boron nitride has a thickness greater than 4 nm and less than 40 nm.

11. The photon detector of claim 1, wherein the circuit comprises an amplifier connected to the two contacts.

12. The photon detector of claim 11, further comprising a matching circuit connected between the two contacts and the amplifier.

13. The photon detector of claim 12, wherein the matching circuit comprises an inductor and a capacitor.

14. The photon detector of claim 11, further comprising a power detector connected to the amplifier.

15. The photon detector of claim 14, further comprising a pulse detector connected to the power detector, the pulse detector comprising a voltage reference and a comparator configured to compare the output of the power detector to the output of the voltage reference.

16. The photon detector of claim 1, wherein the graphene sheet consists of a single atomic layer of graphene.

17. The photon detector of claim 1, wherein the graphene sheet comprises two atomic layers of graphene.

18. The photon detector of claim 1, further comprising a refrigerator configured to cool the graphene sheet to a temperature below 4 K.

19. The photon detector of claim 18, wherein the refrigerator is a pulse tube refrigerator.

20. The photon detector of claim 18, wherein the refrigerator is a Gifford-McMahon cooler.

* * * * *